(12) United States Patent
Sun et al.

(10) Patent No.: US 12,484,302 B2
(45) Date of Patent: Nov. 25, 2025

(54) METHOD FOR MANUFACTURING DRIVE CIRCUIT, DRIVE CIRCUIT AND PHOTOMASK

(71) Applicant: HKC CORPORATION LIMITED, Guangdong (CN)

(72) Inventors: Xiaozhen Sun, Shenzhen (CN); Tianhui Qiu, Shenzhen (CN); Haoxuan Zheng, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 100 days.

(21) Appl. No.: 17/801,449

(22) PCT Filed: Dec. 30, 2021

(86) PCT No.: PCT/CN2021/143322
§ 371 (c)(1),
(2) Date: Jun. 5, 2024

(87) PCT Pub. No.: WO2022/247280
PCT Pub. Date: Dec. 1, 2022

(65) Prior Publication Data
US 2024/0347552 A1     Oct. 17, 2024

(30) Foreign Application Priority Data

May 26, 2021   (CN) .......................... 202110576057.6

(51) Int. Cl.
*H10D 86/01*      (2025.01)
*G03F 1/40*       (2012.01)
(Continued)

(52) U.S. Cl.
CPC .......... *H10D 86/0231* (2025.01); *G03F 1/40* (2013.01); *G03F 7/0007* (2013.01); *G03F 7/40* (2013.01);
(Continued)

(58) Field of Classification Search
CPC .......... H10D 86/0231; G09G 2330/12; G09G 3/006; G03F 7/40; G03F 7/0007; G03F 7/42; G03F 1/40
See application file for complete search history.

(56) References Cited

U.S. PATENT DOCUMENTS

| | | |
|---|---|---|
| 10,014,297 B1 | 7/2018 | Sun et al. |
| 2014/0168559 A1 | 6/2014 | Zhu et al. |

(Continued)

FOREIGN PATENT DOCUMENTS

| | | | |
|---|---|---|---|
| CN | 101566791 A | * | 10/2009 |
| CN | 102967978 A | | 3/2013 |

(Continued)

OTHER PUBLICATIONS

International Search Report issued on Mar. 16, 2022 in corresponding International application No. PC/CN2021/143322; 4 pages.

*Primary Examiner* — Hang Lin
(74) *Attorney, Agent, or Firm* — Maier & Maier, PLLC (57) ABSTRACT

The present application disclosed a method for manufacturing a drive circuit, a drive circuit and a photomask, the method covers a photomask on the photoresist layer and performing exposing; the photomask includes pixel control circuit patterns, and the pixel control circuit patterns are provided with a plurality of interruptions, and a length of the interruption between two adjacent pixel control circuit patterns is a preset distance, to release static electricity generated in the pixel control circuit pattern during exposing; the electrostatic charges on the pixel control circuit patterns can be effectively derived, and the accumulation of electrostatic charges on the pixel control circuit patterns can be avoided, and the probability of electrostatic discharge can be reduced, thereby reducing the risk of damaging to the components used for exposing, and can ensure the integrity of the formed pixel control circuit, so that the drive circuit can operate normally.

14 Claims, 8 Drawing Sheets

(51) Int. Cl.
*G03F 7/00* (2006.01)
*G03F 7/40* (2006.01)
*G03F 7/42* (2006.01)
*G09G 3/00* (2006.01)

(52) U.S. Cl.
CPC ............... *G03F 7/42* (2013.01); *G09G 3/006* (2013.01); *G09G 2330/12* (2013.01)

(56) References Cited

U.S. PATENT DOCUMENTS

2019/0035825 A1* 1/2019 Huang .................. G02F 1/1368
2019/0155139 A1 5/2019 Chang et al.

FOREIGN PATENT DOCUMENTS

| | | |
|---|---|---|
| CN | 103208264 A | 7/2013 |
| CN | 104658973 A | 5/2015 |
| CN | 105630246 A | 6/2016 |
| CN | 106200257 A | 12/2016 |
| CN | 109270786 A | 1/2019 |
| CN | 109491191 A | 3/2019 |
| CN | 110531579 A | 12/2019 |
| JP | 2000321777 A | 11/2000 |
| WO | 2018010228 A1 | 1/2018 |

* cited by examiner

METHOD FOR MANUFACTURING DRIVE CIRCUIT, DRIVE CIRCUIT AND PHOTOMASK

CROSS REFERENCE TO RELATED APPLICATION

The present application is a National phase of international patent application No. PCT/CN2021/143322 with an international filing date of Dec. 30, 2021, designating the USA, now pending, and further claims priority of Chinese Invention Patent application, with application No. 202110576057.6, filed on May 26, 2021 the contents of all of the aforementioned application, including any intervening amendments thereto, are incorporated herein by reference.

TECHNICAL FIELD

The present application relates to the field of display technology, and more particularly to a method for manufacturing a drive circuit, a drive circuit and a photomask.

BACKGROUND

The description herein merely provide background information related to the present application and do not necessarily constitute prior art. With the continuous development of display technology, display panels are widely used in various fields such as entertainment, education, and security. Gate Driver on Array (GOA) technology refers to a driving method in which a Gate driver IC is directly manufactured on an Array substrate to realize line-by-line scanning of the gate. The GOA technology can simplify the manufacturing process of the display panel, save the chip bonding process in the horizontal scanning line direction, and reduce the production cost, and the integration of the display panels can be improved, such that the display panels are lighter and thinner.

In the production process of the display panels using the GOA technology, shorting bar testing is required to light up the display panel to check whether the display panel can display normally, and the manufacture of the drive circuit for the shorting bar testing needs to go through a series of processes, during exposing, the photomask is prone to accumulating charges and causing Electro Static Discharge (ESD), resulting in circuit damage in the corresponding area of the photomask and affecting the yield of manufacturing the drive circuit.

TECHNICAL PROBLEM

One of objects of embodiments of the present application is to provide a method for manufacturing a drive circuit, a drive circuit and a photomask, in order to solve the problem that during exposing, the photomask is prone to accumulating charges and causing Electro Static Discharge (ESD), resulting in circuit damage in the corresponding area of the photomask and affecting the yield of manufacturing the drive circuit.

SUMMARY

The technical solution adopted in embodiments of the present application is:

In a first aspect, a method for manufacturing a drive circuit is provided, the method includes:
covering a conductive layer on a substrate;
covering a photoresist layer on the conductive layer;
covering a photomask on the photoresist layer and performing exposing; the photomask includes pixel control circuit patterns, and the pixel control circuit patterns are provided with a plurality of interruptions configured to release static electricity generated in the pixel control circuit pattern during exposing, and a length of the interruption between two adjacent pixel control circuit patterns is a preset distance;
developing to the photoresist layer, and removing an area of the photoresist layer not covered by the pixel control circuit patterns to form a photoresist area; and
etching the conductive layer, and removing an area of the conductive layer not covered by the photoresist area to form the pixel control circuit.

In a second aspect, a drive circuit is provided, and the drive circuit includes: a pixel control circuit including a first pixel control circuit, a second pixel control circuit and a third pixel control circuit; and a switch module including: a first switch unit, a second switch unit and a third switch unit;
the first pixel control circuit is connected to the first switch unit and configured for outputting a first color pixel control signal, and the first switch unit is configured for controlling the first color pixel control signal being output to a display panel;
the second pixel control circuit is connected to the second switch unit and configured for outputting a second color pixel control signal, and the second switch unit is configured for controlling the second color pixel control signal being output to the display panel; and the third pixel control circuit is connected to the third switch unit and configured for outputting a third color pixel control signal, and the third switch unit is configured for controlling the third color pixel control signal being output to the display panel.

In a third aspect, a photomask is provided, which includes pixel control circuit patterns, and the pixel control circuit patterns are provided with a plurality of interruptions configured to release static electricity generated in the pixel control circuit pattern during exposing, and a length of the interruption between two adjacent pixel control circuit patterns is a preset distance.

BENEFIT EFFECT

The beneficial effects of the method for manufacturing the drive circuit provided by the embodiment of the present application are that the electrostatic charge on the pixel control circuit patterns can be effectively derived, and the accumulation of the electrostatic charges on the pixel control circuit patterns can be avoided, and the probability of electrostatic discharge can be reduced, thereby the risk of damage to the components used for exposing is reduced, and the integrity of the formed pixel control circuit can be ensured, so that the drive circuit can operate normally.

The beneficial effects of the drive circuit provided by the embodiments of the present application are that the pixel control circuit is configured to output color pixel control signals, the switch unit is configured to control the color pixel control signals to be output to the display panel, and can be used to perform a shorting bar testing on the display panel, and determining whether the display panel is faulty according to the display picture.

The beneficial effects of the photomask provided by the embodiments of the present application can be made to the relevant description in the above-mentioned method for manufacturing the drive circuit, which will not be repeated here.

BRIEF DESCRIPTION OF THE DRAWINGS

In order to explain the embodiments of the present application more clearly, a brief introduction regarding the accompanying drawings that need to be used for describing the embodiments of the present application or the prior art is given below; it is obvious that the accompanying drawings described as follows are only some embodiments of the present application, for those skilled in the art, other drawings can also be obtained according to the current drawings on the premise of paying no creative labor.

DETAILED DESCRIPTION

In order to make the purpose, technical solutions and advantages of the present application more clearly understood, the present application will be described in further detail below with reference to the accompanying drawings and embodiments. It should be understood that the specific embodiments described herein are only used to explain the present application, but not to limit the present application.

It should be noted that the orientations or positional relationships indicated by the terms "upper", "lower", "left", "right", etc. are based on the orientations or positional relationships shown in the accompanying drawings, and are only for the convenience of description, rather than indicating or it is implied that the referred device or element must have a specific orientation, be constructed and operated in a specific orientation, and therefore cannot be construed as a limitation on the present application. For those of ordinary skill in the art, the specific meanings of the above terms can be understood according to specific situations. The terms "first" and "second" are only used for the purpose of description, and should not be understood as indicating or implying relative importance or implying indicating the number of technical features. "Plurality" means two or more, unless expressly specifically limited otherwise.

In order to illustrate the technical solutions provided in the present application, the following detailed description is given in conjunction with the specific drawings and embodiments.

The embodiments of the present application provide a method for manufacturing a drive circuit, which can be applied to the manufacturing process of a drive circuit of a display panel. Specifically, which can be realized when a photomask covers on a substrate and performs exposing. By arranging multiple interruptions on the pixel control circuit patterns of the photomask, which reduces the static electricity generated on the photomask during the exposing process, so as to reduce the probability of electrostatic discharges on the photomask, thereby improving the yield of manufacturing the drive circuit, and further improving the yield of the display panel production.

In applications, the display panel may be a liquid crystal display panel based on a Thin Film Transistor Liquid Crystal Display (TFT-LCD) technology, a liquid crystal display panel based on a Liquid Crystal Display (LCD) technology, an organic electric laser display panel based on an Organic Light-Emitting Diode (OLED) technology, a quantum dot light-emitting diode display panel or curved display panel based on Quantum Dot Light Emitting Diodes (QLED) technology, etc.

Embodiment 1

Figure 1:
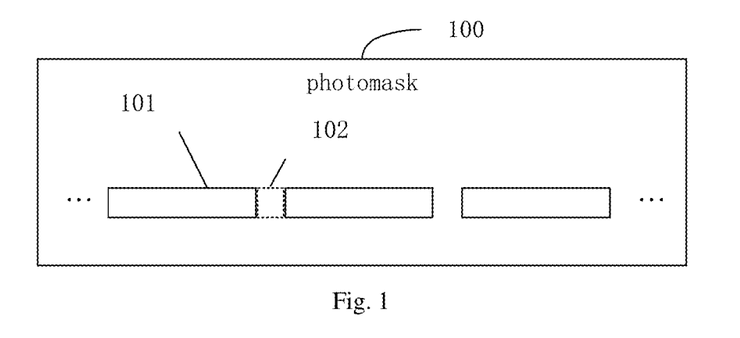
FIG. 1 is a first structural schematic diagram of a photomask provided by an embodiment of the present application.

As shown in FIG. 1, the embodiment 1 of the present application exemplarily shows a first structural schematic diagram of a photomask 100; the photomask 100 includes pixel control circuit patterns 101, and the pixel control circuit patterns 101 are provided with a plurality of interruptions 102) configured to release static electricity generated in the pixel control circuit pattern 101 during exposing, and a length of the interruption 102 between two adjacent pixel control circuit patterns 101 is a preset distance.

In applications, the photomask can be different types of photomasks such as metal photomasks, glass photomasks, and the like. The photomask is provided with a design pattern, which can be arranged according to actual needs. The design pattern on the photomask can be mapped on the photoresist by exposing through the exposure machine. The photoresist is covered on the conductive layer, and the conductive layer is covered on the substrate. After developing, baking, etching, stripping and other processes, a conductive circuit or component with the same shape as the design pattern can be obtained. The design pattern of the photomask can be hollowed out or non-hollowed out, specifically, when the design pattern of the photomask is hollowed out, the remaining area of the photomask is non-hollowed out; when the design pattern of the photomask is non-hollowed out, the remaining area of the photomask is hollowed out.

In applications, the pixel control circuit patterns are used as the design pattern. When the pixel control circuit patterns are hollowed out, the interruptions and non-design patterns are non-hollowed out; when the pixel control circuit patterns are non-hollowed out, the interruptions and non-design patterns are hollowed out. Due that when the pixel control circuit patterns of the photomask are exposed, the existing pixel control circuit patterns are easy to generate or absorb static electricity, and since the existing pixel control circuit patterns include a complete circuit pattern without interruptions, the length is long, so that the electrostatic charges are easily accumulated on the existing pixel control circuit patterns. When the electrostatic charges accumulated reaches a certain amount, electrostatic discharge will occur, resulting in damage to the formed pixel control circuits and even damage to the components used for exposing. In the embodiment, by setting interruptions on the pixel control circuit patterns, the electrostatic charges on the pixel control circuit patterns can be effectively derived, and the accumulation of electrostatic charges on the pixel control circuit patterns can be avoided, the probability of electrostatic discharge is reduced, and the formed pixel control circuit is a complete pixel control circuit, and the risk of damage to components used for exposing is reduced.

Embodiment 2

Figure 2:
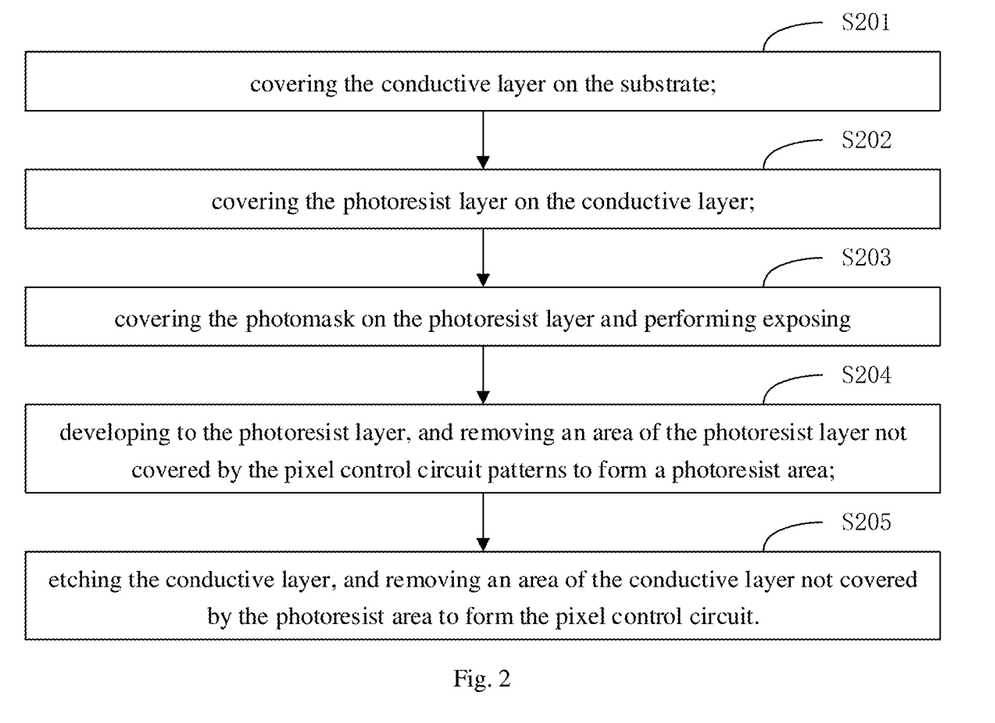
FIG. 2 is a first schematic flowchart of a method for manufacturing a drive circuit provided by an embodiment of the present application.

As shown in FIG. 2, a method for manufacturing a drive circuit provided in the embodiment 2 of the present application is used to manufacture the photomask 100 provided in the embodiment 1 corresponding to FIG. 1, including steps S201 to S205:

Step S201: covering the conductive layer on the substrate;

Step S202: covering the photoresist layer on the conductive layer;

Step S203: covering the photomask on the photoresist layer and performing exposing; the photomask includes pixel control circuit patterns, and the pixel control circuit patterns are provided with a plurality of interruptions configured to release static electricity generated in the pixel control circuit pattern during exposing, and a length of the interruption between two adjacent pixel control circuit patterns is a preset distance;

Step S204: developing to the photoresist layer, and removing an area of the photoresist layer not covered by the pixel control circuit patterns to form a photoresist area;

Step S205: etching the conductive layer, and removing an area of the conductive layer not covered by the photoresist area to form the pixel control circuit.

In applications, covering the conductive layer on the substrate, covering the photoresist layer on the conductive layer, developing the photoresist, and etching the conductive layer are the existing processes of manufacturing the drive circuit, which will not be repeated here. The difference is that by including pixel control circuit patterns with interruptions covering the photoresist layer for exposing, the static electricity generated in the pixel control circuit patterns during exposing can be released, and the integrity of the formed pixel control circuit will not be affected. The exposing process and mask of the embodiment are described in detail below.

In applications, by covering the photoresist layer with the photomask and performing exposing by an exposure machine covering the photomask, a shape consistent with the pixel control circuit patterns can be obtained in the area of the photoresist layer covered by the pixel control circuit patterns. The substrate can be a glass substrate, a ceramic substrate, or a metal base printed circuit board (MBPCB), specifically the substrate can be an indium tin oxide glass substrate, and the embodiments of the present application do not impose any limitations on the types of substrates.

In applications, due to the limitation of the resolution accuracy of the exposure machine, when the exposure machine exposes the interruption with a length being less than the resolution accuracy in the photomask, the exposure machine will not be able to resolve the interruption, so the circuit obtained on the photoresist layer after exposing is continuous and does not have interruption. The preset distance represents the length less than the resolution accuracy of the exposure machine. When the length of the interruption between two adjacent pixel control circuit patterns is at the preset distance, the area covered by the pixel control circuit patterns on the photoresist layer after exposing is continuous and does not have interruption. In actual application, the value of the preset distance can be determined according to the resolution accuracy of the exposure machine. Specifically, the value range of the preset distance is smaller than the minimum resolution accuracy of the exposure machine, or, the value range of the preset distance is included in the precision range that the exposure machine cannot resolve, for example, when the minimum resolution accuracy of the exposure machine is 1 µm, the value range of the preset distance can be any interval less than 1 µm; or when the exposure machine cannot resolve the interruption with a length of 0.5 µm to 1 µm, the value range of the preset distance can be any open interval between 0.5 µm and 1 µm. The embodiments of the present application do not impose any limitations on the value range of the preset distance.

In one embodiment, after step S205, the method includes:
stripping the substrate to remove a remaining photoresist covered on the substrate.

In applications, after the processes of exposing, developing and etching, the conductive circuit or components consistent with the design pattern can be obtained, but in the process of developing and etching, it is easy to make the removed photoresist adhere to the substrate, by stripping the substrate with the stripping liquid, and the remaining photoresist covering the substrate can be removed to ensure the performance of the substrate and the remaining photoresist can be recovered.

Figure 3:
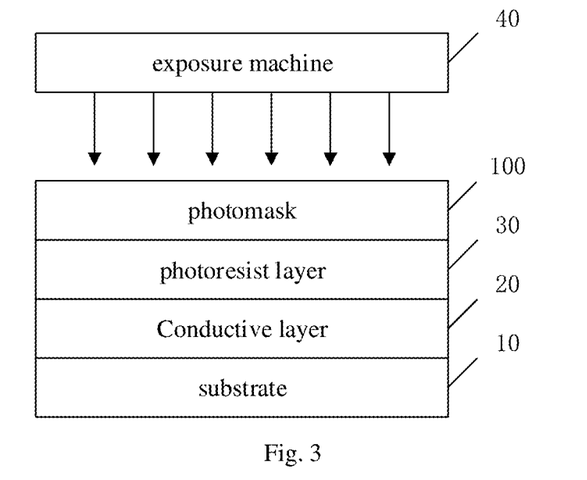
FIG. 3 is a schematic diagram of a scene when a substrate, a conductive layer, a photoresist layer and a photomask are exposed under an exposure machine provided in an embodiment of the present application.

FIG. 3 exemplarily shows a schematic diagram of a scene when the substrate 10, the conductive layer 20, the photoresist layer 30 and the photomask 100 are exposed under the exposure machine 40.

It should be noted that the schematic diagram of the scene in FIG. 3 is a front view of the substrate 10, the conductive layer 20, the photoresist layer 30, the photomask 100 and the exposure machine 40, and the schematic structural diagram of the photomask 100 in FIG. 1 and other drawings is a top view of the photomask 100.

Embodiment 3

Figure 4:
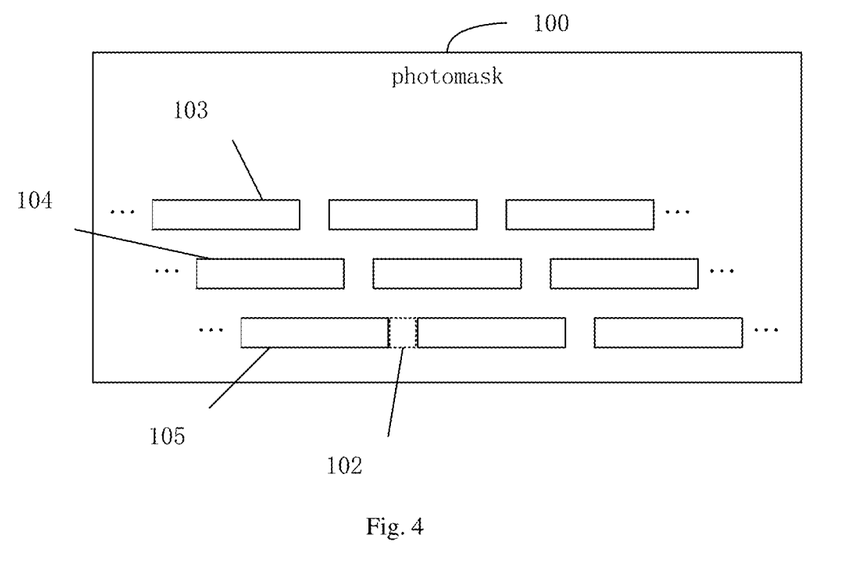
FIG. 4 is a second structural schematic diagram of a photomask provided by an embodiment of the present application.

As shown in FIG. 4, the embodiment 3 of the present application exemplarily shows a second structural schematic diagram of the photomask 100, and the pixel control circuit patterns 101 include:

a first color pixel control circuit pattern 103, configured to cover a photoresist layer for exposing, and after the photoresist layer is developed and a conductive layer is etched, to form a first color pixel control circuit;

a second color pixel control circuit pattern 104, configured to cover the photoresist layer for exposing, and after the photoresist layer is developed and the conductive layer is etched, to form a second color pixel control circuit; and a third color pixel control circuit pattern 105, configured to cover the photoresist layer for exposing, and after the photoresist layer is developed and the conductive layer is etched, to form a third color pixel control circuit.

In applications, the arranging of the interruptions in the patterns of the first color pixel control circuit pattern, the second color pixel control circuit pattern, and the third color pixel control circuit pattern are the same, which is not repeated here. The difference is that the length of the interruptions on the first color pixel control circuit pattern, the second color pixel control circuit pattern, and the third color pixel control circuit pattern can be the preset circuit distance, so that more space can be reserved between first color pixel control circuit, the second color pixel control circuit, and third color pixel control circuit for wire connection, which is convenient for the wiring of the drive circuit, and the preset circuit distance can be arranged according to actual needs.

Embodiment 4

Figure 5:
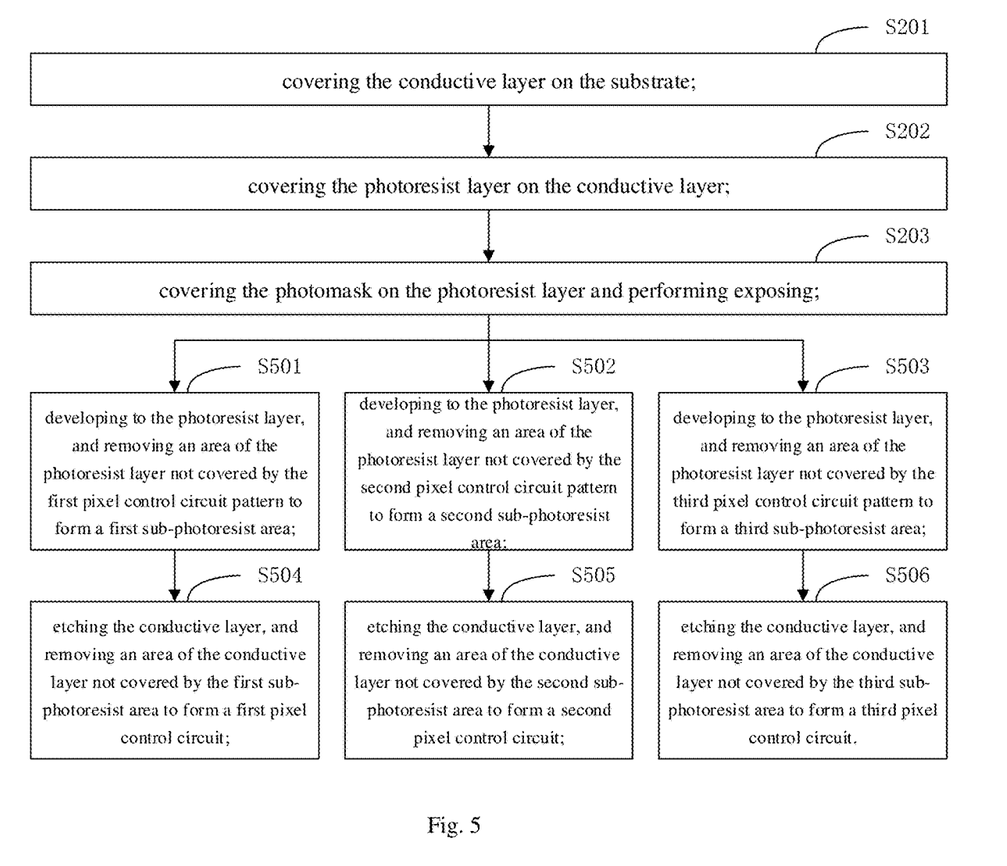
FIG. 5 is a second schematic flowchart of a method for manufacturing a drive circuit provided by an embodiment of the present application.

As shown in FIG. 5, based on the manufacturing method provided in the embodiment 2 corresponding to FIG. 2, the manufacturing method provided in the embodiment 4 of the present application is used to manufacture the photomask 100 provided in the embodiment 3 corresponding to FIG. 4. Step S204 includes Steps S501 to S503, and step S205 include steps S504 to S506:

Step S501, developing to the photoresist layer, and removing an area of the photoresist layer not covered by the first pixel control circuit pattern to form a first sub-photoresist area;

Step S502, developing to the photoresist layer, and removing an area of the photoresist layer not covered by the second pixel control circuit pattern to form a second sub-photoresist area; and Step S503, developing to the photoresist layer, and removing an area of the photoresist layer not covered by the third pixel control circuit pattern to form a third sub-photoresist area;

Step S504, etching the conductive layer, and removing an area of the conductive layer not covered by the first sub-photoresist area to form a first pixel control circuit;

Step S505, etching the conductive layer, and removing an area of the conductive layer not covered by the second sub-photoresist area to form a second pixel control circuit; and Step S506, etching the conductive layer, and removing an area of the conductive layer not covered by the third sub-photoresist area to form a third pixel control circuit.

In applications, the pixel control circuit pattern of the photomask can include the first color pixel control circuit pattern, the second color pixel control circuit pattern, and the third color pixel control circuit pattern of three colors of pixel control circuit patterns. The exposing, developing and etching methods of the first control circuit pattern, the second color pixel control circuit pattern, and the third color pixel control circuit pattern are the same as the exposing, developing and etching methods in the above steps S203 to S205, and which will not be repeated here. The difference is that the steps S203 to S205 are used for exposing, developing and etching one pixel control circuit pattern of the photomask. When the photomask includes the pixel control circuit patterns of the above three colors, the above control circuit patterns of three colors can be simultaneously exposed, developed and etched.

In applications, the arranging of the interruptions in the patterns of the first color pixel control circuit pattern, the second color pixel control circuit pattern, and the third color pixel control circuit pattern are the same as the interruptions for the above pixel control circuit patterns, and which will not be repeated here.

Embodiment 5

Figure 6:
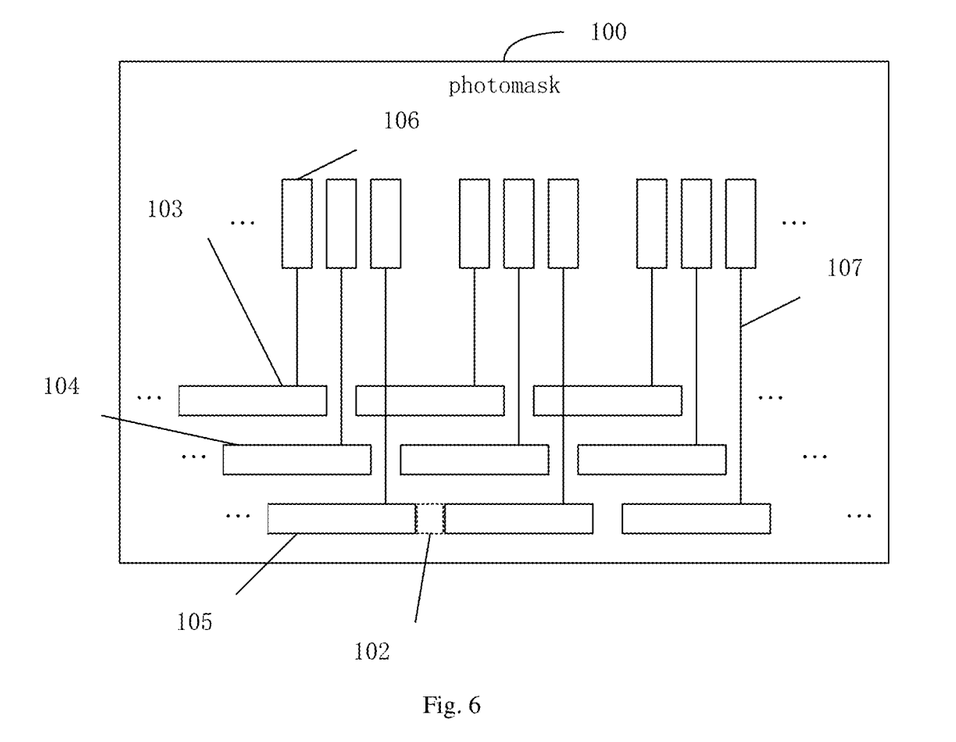
FIG. 6 is a third structural schematic diagram of a photomask provided by an embodiment of the present application.

As shown in FIG. 6, the embodiment 5 of the present application exemplarily shows a third structural schematic diagram of the photomask 100; and the photomask 100 further includes:

a switch module pattern 106 configured for covering on the photoresist layer and performing exposing to form the switch module after developing and etching.

In applications, the switch module pattern can include multiple switch patterns, the switch patterns can be the patterns of the transistor that plays a switching role in the circuit, and the transistor that plays a switching role can be an NPN type triode or a PNP type triode, specifically, which can be a thin film field transistor (TFT).

In one embodiment, the photomask further includes:

a wire pattern 107 configured for covering on the photoresist layer and performing exposing to form the wires of the pixel control circuit after developing and etching.

In applications, the photomask may include multiple wire patterns, the wire patterns and the switch patterns correspond one-to-one, and one wire pattern can be connected to one switch pattern and one pixel control circuit pattern; specifically, one wire pattern can be connected to one switch pattern and one first color pixel control circuit pattern, can also be connected with one switch pattern and one second color pixel control circuit pattern, and can also be connected with one switch pattern and one third color pixel control circuit pattern.

Embodiment 6

Figure 7:
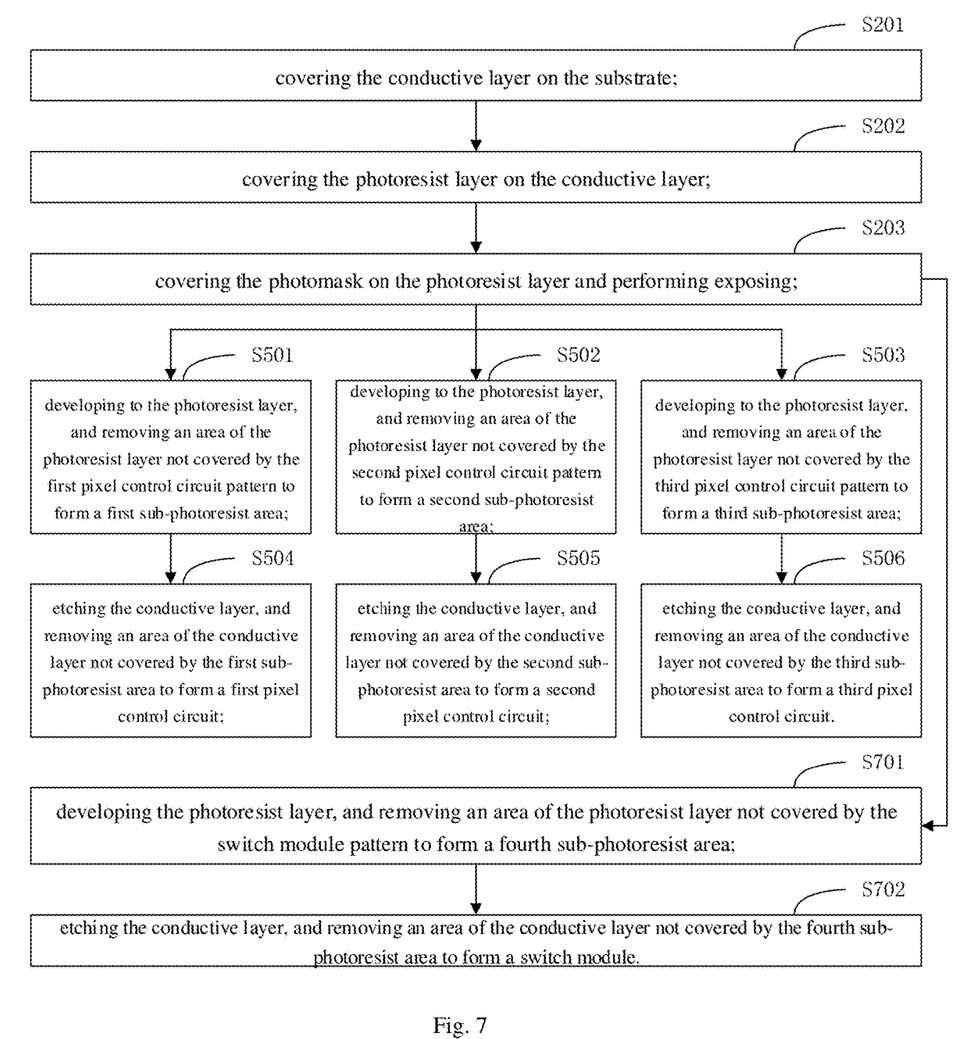
FIG. 7 is a third schematic flowchart of a method for manufacturing a drive circuit provided by an embodiment of the present application.

As shown in FIG. 7, based on the manufacturing method provided by the embodiment 4 corresponding to FIG. 5, the manufacturing method provided by the embodiment 6 of the present application is used to manufacture the photomask 100 provided by the embodiment 5 corresponding to FIG. 6. The Step S204 includes Step S701, and the step S205 includes step S702:

S701, developing the photoresist layer, and removing an area of the photoresist layer not covered by the switch module pattern to form a fourth sub-photoresist area; and S702, etching the conductive layer, and removing an area of the conductive layer not covered by the fourth sub-photoresist area to form a switch module.

In applications, the switch module pattern can include multiple switch patterns. Since the switch patterns can be patterns of a transistor that plays a switching role in the circuit, when the switch pattern is a triode pattern, the distance between the source electrode and the drain electrode of the triode pattern is too close, which leads to the easy accumulation of electrostatic charges between the source electrode and the drain electrode of the triode pattern during exposing and leads to electrostatic discharge.

In applications, the step S701 and step S702 can be performed after step S504 to step S506, or can be performed before step S501 to step S503, the embodiment of the present application does not impose any limitations on the execution order of step S701 and step S702.

In one embodiment, the step S701 further includes:
developing the photoresist layer, and removing an area of the photoresist layer not covered by the wire pattern to form a fifth sub-photoresist area.

The step S702 further includes:
developing the photoresist layer, and removing an area of the photoresist layer not covered by the fifth sub-photoresist area to form wires of the pixel control circuit.

In applications, the pixel control circuit can specifically be the first pixel control circuit, the second pixel control circuit, and the third pixel control circuit.

In applications, since the switch module patterns are connected with the pixel control circuit patterns through the wire pattern in the photomask, which is easy to cause electrostatic discharge together with the wire pattern and the pixel control circuit patterns. By arranging multiple interruptions on the pixel control circuit patterns, the electrostatic charges on the switch pattern can be derived, and the accumulation of electrostatic charges on the pixel control circuit patterns can be avoided, which reduces the probability of electrostatic discharge, such that the exposed pixel control circuit and pixel control circuit patterns are consistent, and reduce the risk of damage to the components used for exposing.

In the method for manufacturing the drive circuit provided by the embodiment of the present application, by covering the conductive layer on a substrate; covering the photoresist layer on the conductive layer; covering the photomask on the photoresist layer and performing exposing; the photomask includes the pixel control circuit patterns, and the pixel control circuit patterns are provided with a plurality of interruptions, and the length of the interruption between two adjacent pixel control circuit patterns is a preset distance, to release static electricity generated in the pixel control circuit pattern during exposing; developing to the photoresist layer, and removing an area of the photoresist layer not covered by the pixel control circuit patterns to form the photoresist area; and etching the conductive layer, and removing an area of the conductive layer not covered by the photoresist area to form the pixel control circuit, the electrostatic charges on the pixel control circuit patterns can be effectively derived, and the accumulation of electrostatic charges on the pixel control circuit patterns can be avoided, and the probability of electrostatic discharge can be reduced, thereby reducing the risk of damaging to the components used for exposing, and can ensure the integrity of the formed pixel control circuit, so that the drive circuit can operate normally.

It should be understood that the size of the sequence numbers of the steps in the above embodiments does not mean the sequence of execution, and the execution sequence of each process should be determined by its function and internal logic, and should not constitute any limitations to the implementation process of the embodiments of the present application.

Embodiment 7

Figure 8:
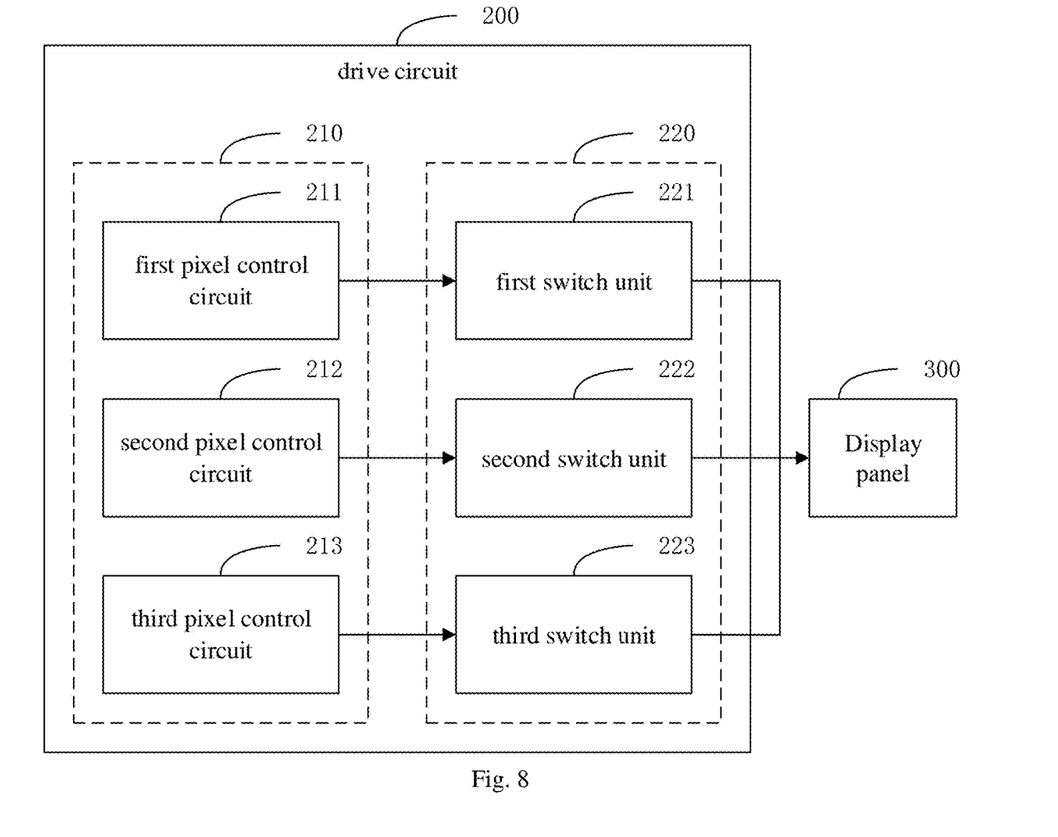
FIG. 8 is a first structural schematic diagram of a drive circuit provided by an embodiment of the present application.

As shown in FIG. 8, the drive circuit 200 provided in the embodiment 7 of the present application includes a pixel control circuit 210 and a switch module 220, and the pixel control circuit 210 includes a first pixel control circuit 211, a second pixel control circuit 212 and a third pixel control circuit 213, the switch module 220 includes a first switch unit 221, a second switch unit 222 and a third switch unit 223:

the first pixel control circuit 211 is connected to the first switch unit 221 and configured for outputting a first color pixel control signal, and the first switch unit 221 is configured for controlling the first color pixel control signal being output to a display panel 300;

the second pixel control circuit 212 is connected to the second switch unit 222 and configured for outputting a second color pixel control signal, and the second switch unit 222 is configured for controlling the second color pixel control signal being output to the display panel 300; and the third pixel control circuit 213 is connected to the third switch unit 223 and configured for outputting a third color pixel control signal, and the third switch unit 223 is configured for controlling the third color pixel control signal being output to the display panel 300.

In applications, the first color, the second color and the third color can be one of the three primary colors respectively. Specifically, the first color can be red, the second color can be green, and the third color can be blue. Therefore, the first color pixel control circuit can be a red pixel control circuit, and the first color pixel control signal is a red pixel control signal; the second color pixel control circuit can be a green pixel control circuit, and the second color pixel control signal is a green pixel control signal; the third color pixel control circuit can be a blue pixel control circuit, and the third color control signal is a blue pixel control signal, so as to form an RGB pixel control circuit and an RGB control signal.

In applications, a plurality of first pixel control circuits and a plurality of first switch units are connected in one-to-one correspondence, and one first switch unit is configured to control the first color pixel control signal sent by the correspondingly connected first pixel control circuit to output to the display panel, specifically, when one first switch unit is turned on, the first color pixel control signal sent by the correspondingly connected first pixel control circuit can be output to the display panel, and when one first switch unit is turned off, the first color pixel control signal sent by the correspondingly connected first pixel control circuit stops outputting to the display panel. The operation principles of the second switch unit and the second pixel control circuit, and the operation principles of the third switch unit and the third pixel control circuit are the same as those of the first switch unit and the first pixel control circuit described above, and which will not be repeated here.

In applications, any one color pixel control signal among the first color pixel control signal, the second color pixel control signal and the third color pixel control signal can be controlled to achieve outputting alone by the first switch unit, the second switch unit and the third switch unit, which can also mix and output any two color pixel control signals, and can also mix and output three color pixel control signals. When one color pixel control signal is output alone, the display panel displays a solid color picture, and which can be determined whether any color pixel of the display panel is faulty according to the display picture; when any two color pixel control signals are mixed and output, which can be determined according to the display picture whether a fault will occur when any two color pixels of the display panel are mixed and output; when three color pixel control signals are mixed and output, which can be determined according to the display picture whether a faulty occur when the three pixels of the display panel are mixed and output.

Embodiment 8

Figure 9:
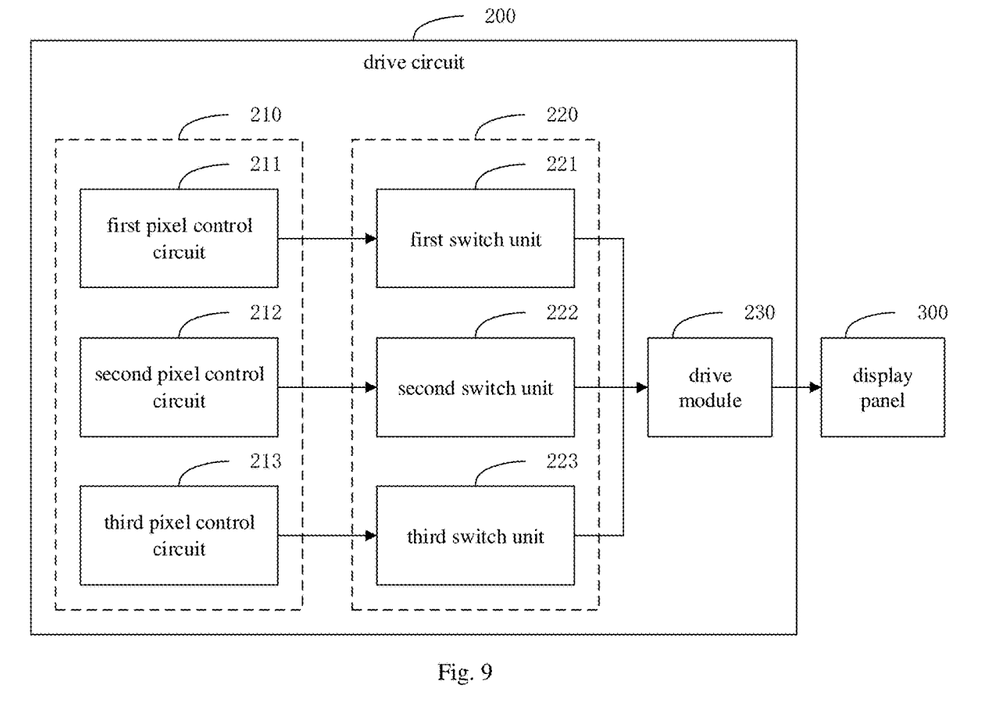
FIG. 9 is a second structural schematic diagram of a drive circuit provided by an embodiment of the present application.

As shown in FIG. 9, in the drive circuit provided in the embodiment 8 of the present application, based on the embodiment 7 corresponding to FIG. 8, the drive circuit 200 further includes a drive module 230, which is connected to the first switch unit 221 and the second switch unit 222, and the third switch unit 223, respectively. The drive module 230 is configured to output a first drive signal to the display panel 300 according to the first color pixel control signal, and further configured to output a second drive signal to the display panel 300 according to the second color pixel control signal, and further configured to output a third drive signal to the display panel 300 according to the third color pixel control signal, to drive the display panel 300 to display a picture.

In applications, the drive module can output corresponding pixel drive signal to the display panel according to the pixel control signal, so as to drive the display panel to display the picture. The display panel can include pixels of various colors, and may specifically include red pixels, green pixels and blue pixels. The pixel drive signal can be used to drive the pixel of the corresponding color in the display panel to emit light according to the color pixel drive signal, and can also be configured to drive the light-emitting degree of the pixel of the display panel according to the voltage of the pixel control signal to adjust the grayscale level of the pixel, so as to convert the electrical signal of the pixel control signal into the optical signal of the display picture of the display panel, so as to perform a shorting bar testing on the display panel; when the display panel displays according to the output pixel control signal, which indicates that the display panel is normal, and when the display panel is not displayed according to the output pixel control signal, which indicates that the display panel is faulty, and it can be determined whether the pixel of the corresponding color of the display panel is faulty by changing the colors of the color pixel control signals.

In applications, when the display panel is a liquid crystal display panel based on TFT technology, the pixel drive signal is the source electrode drive signal of the TFT of the pixel of the display panel. Therefore, when a switch is turned on and sends the pixel control signal to the drive module, the drive module can control the liquid crystal deflection degree of one pixel according to the pixel drive signal output by the above pixel control signal, so as to control the light-emitting degree of the pixel.

Embodiment 9

Figure 10:
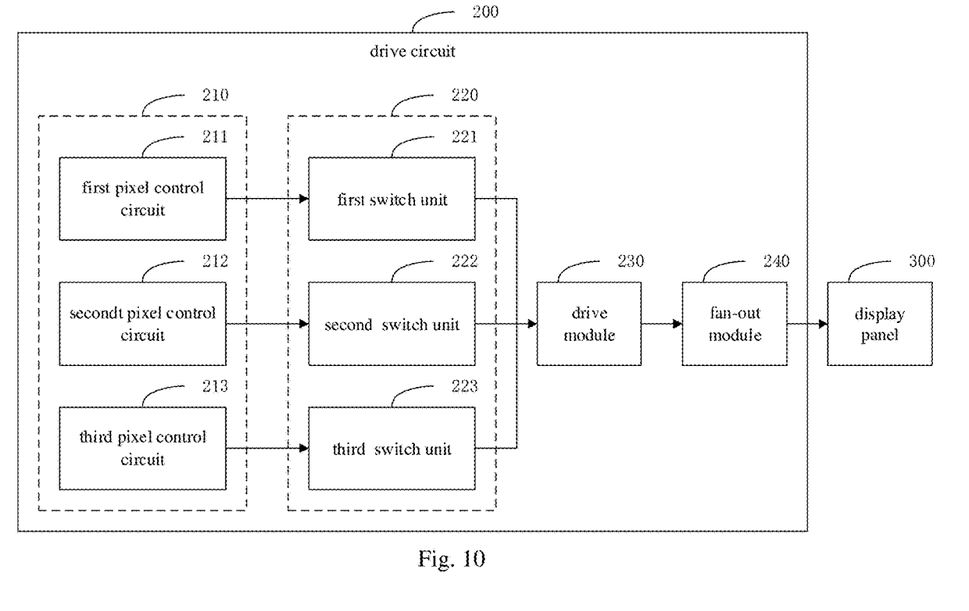
FIG. 10 is a third structural schematic diagram of the drive circuit provided by an embodiment of the present application.

As shown in FIG. 10, in the drive circuit provided by the embodiment 9 of the present application, in one embodiment, based on the embodiment 8 corresponding to FIG. 9, the drive circuit 200 further includes a fan-out module 240, the fan-out module 240 and the drive module 230 are connected, and configured for sending the first drive signal, the second drive signal and the third drive signal to the display panel 300.

In applications, the fan-out module can include multiple fan-out circuits, and a pixel drive signal sent by one fan-out circuit corresponds to a pixel control signal sent by one switch.

The drive circuit provided by the embodiment of the present application includes a pixel control circuit and a switch module. The pixel control circuit is configured to output color pixel control signals, and the switch unit is configured to control the color pixel control signals to be output to the display panel, and can be configured to perform shorting bar testing on the display panel, and determining whether the display panel is faulty according to the display picture.

In the foregoing embodiments, the description of each embodiment has its own emphasis. For parts that are not described in detail in some embodiments, reference may be made to the relevant descriptions of other embodiments.

The above are only optional embodiments of the present application, and are not intended to limit the present application. Various modifications and variations of the present application are possible for those skilled in the art. Any modification, equivalent replacement, improvement, etc. made within the principles of the present application shall be included within the scope of the claims of the present application.

What is claimed is:

1. A method for manufacturing a drive circuit, the drive circuit having a pixel control circuit, the method comprising:
    covering a conductive layer on a substrate;
    covering a photoresist layer on the conductive layer;
    covering a photomask on the photoresist layer and performing exposure; wherein the photomask comprises pixel control circuit patterns, and the pixel control circuit patterns are provided with a plurality of interruptions configured to release static electricity generated in the pixel control circuit pattern during exposure, and a length of the interruption between two adjacent pixel control circuit patterns is a preset distance;
    developing to the photoresist layer, and removing an area of the photoresist layer not covered by the pixel control circuit patterns to form a photoresist area; and
    etching the conductive layer, and removing an area of the conductive layer not covered by the photoresist area to form the pixel control circuit;
    wherein the pixel control circuit comprises a first color pixel control circuit, a second color pixel control circuit and a third color pixel control circuit; and
    the pixel control circuit patterns comprise a first color pixel control circuit pattern, a second color pixel control circuit pattern and, a third color pixel control circuit pattern;
    the step of developing to the photoresist layer, and removing an area of the photoresist layer not covered by the pixel control circuit patterns to form a photoresist area comprises:
    developing to the photoresist layer, and removing an area of the photoresist layer not covered by the first pixel control circuit pattern to form a first sub-photoresist area;
    developing to the photoresist layer, and removing an area of the photoresist layer not covered by the second pixel control circuit pattern to form a second sub-photoresist area; and
    developing to the photoresist layer, and removing an area of the photoresist layer not covered by the third pixel control circuit pattern to form a third sub-photoresist area.

2. The method for manufacturing a drive circuit according to claim 1, wherein a value range of the preset distance is smaller than a minimum resolution accuracy of an exposure machine.

3. The method for manufacturing a drive circuit according to claim 1, wherein the step of etching the conductive layer, and removing an area of the conductive layer not covered by the photoresist area to form the pixel control circuit comprises:
    etching the conductive layer, and removing an area of the conductive layer not covered by the first sub-photoresist area to form a first pixel control circuit;

etching the conductive layer, and removing an area of the conductive layer not covered by the second sub-photoresist area to form a second pixel control circuit; and etching the conductive layer, and removing an area of the conductive layer not covered by the third sub-photoresist area to form a third pixel control circuit.

4. The method for manufacturing a drive circuit according to claim 1, wherein the photomask further comprises a switch module pattern; and after covering the photomask on the photoresist layer, and performing exposure, comprising:

developing the photoresist layer, and removing an area of the photoresist layer not covered by the switch module pattern to form a fourth sub-photoresist area.

5. The method for manufacturing a drive circuit according to claim 4, wherein after developing the photoresist layer, and removing an area of the photoresist layer not covered by the switch module pattern, forming a fourth sub-photoresist area, the forming of the fourth sub-photoresist area comprising:

etching the conductive layer, and removing an area of the conductive layer not covered by the fourth sub-photoresist area to form a switch module.

6. The method for manufacturing a drive circuit according to claim 1, wherein the photomask further comprises a wire pattern; and after covering the photomask on the photoresist layer, performing exposure, comprising:

developing the photoresist layer, and removing an area of the photoresist layer not covered by the wire pattern to form a fifth sub-photoresist area.

7. The method for manufacturing a drive circuit according to claim 6, wherein after developing the photoresist layer, and removing an area of the photoresist layer not covered by the wire pattern, forming a fifth sub-photoresist area, the forming of the fifth sub-photoresist area comprising:

developing the photoresist layer, and removing an area of the photoresist layer not covered by the fifth sub-photoresist area to form wires of the pixel control circuit.

8. The method for manufacturing a drive circuit according to claim 1, wherein after etching the conductive layer and removing an area of the conductive layer not covered by the photoresist area, forming the pixel control circuit, comprising:

stripping the substrate to remove a remaining photoresist covered on the substrate.

9. A drive circuit, manufactured based on the method for manufacturing the drive circuit according to claim 1, comprising:

a pixel control circuit, comprising: a first pixel control circuit, a second pixel control circuit and a third pixel control circuit; and a switch module, comprising: a first switch unit, a second switch unit and a third switch unit;

wherein the first pixel control circuit is connected to the first switch unit and configured to output a first color pixel control signal, and the first switch unit is configured to control the first color pixel control signal output to a display panel;

the second pixel control circuit is connected to the second switch unit and configured to output a second color pixel control signal, and the second switch unit is configured to control the second color pixel control signal output to the display panel; and the third pixel control circuit is connected to the third switch unit and configured to output a third color pixel control signal, and the third switch unit is configured to control the third color pixel control signal output to the display panel.

10. The drive circuit according to claim 9, wherein the drive circuit further comprises a drive module, wherein;

the drive module is connected with the first switch unit, the second switch unit and the third switch unit, respectively, and the drive module is configured to output a first drive signal to the display panel according to the first color pixel control signal, and further configured to output a second drive signal to the display panel according to the second color pixel control signal, and further configured to output a third drive signal to the display panel according to the third color pixel control signal, to drive the display panel to display a picture.

11. The drive circuit according to claim 10, wherein the drive circuit further comprises a fan-out module;

the fan-out module is connected to the drive module and configured to send the first drive signal, the second drive signal and the third drive signal to the display panel.

12. A photomask, comprising pixel control circuit patterns, and the pixel control circuit patterns provided with interruptions configured to release static electricity generated in the pixel control circuit pattern during exposure, and the length of the interruption between two adjacent pixel control circuit patterns is a preset distance;

wherein the pixel control circuit patterns comprise:

a first color pixel control circuit pattern configured to cover a photoresist layer for exposing, and after the photoresist layer is developed and a conductive layer is etched, to form a first color pixel control circuit;

a second color pixel control circuit pattern configured to cover the photoresist layer for exposing, and after the photoresist layer is developed and the conductive layer is etched, to form a second color pixel control circuit; and a third color pixel control circuit pattern configured to cover the photoresist layer for exposing, and after the photoresist layer is developed and the conductive layer is etched, to form a third color pixel control circuit.

13. The photomask according to claim 12, wherein the photomask further comprises a switch module pattern configured to cover the photoresist layer and exposing, to form a switch module after developing and etching.

14. The photomask according to claim 13, wherein the photomask further comprises a wire pattern respectively connected with the pixel control circuit patterns and the switch module pattern, the wire pattern is configured to cover the photoresist layer and exposing, to form wires of the pixel control circuit after developing and etching.

\* \* \* \* \*